United States Patent
Chan et al.

(10) Patent No.: US 9,809,451 B2
(45) Date of Patent: Nov. 7, 2017

(54) CAPACITIVE SENSING STRUCTURE WITH EMBEDDED ACOUSTIC CHANNELS

(71) Applicant: Invensense, Inc., San Jose, CA (US)

(72) Inventors: Mei-Lin Chan, Sunnyvale, CA (US); Xiang Li, Mountain View, CA (US); Martin Lim, San Mateo, CA (US)

(73) Assignee: INVENSENSE, INC., San Jose, CA (US)

(*) Notice: Subject to any disclaimer, the term of this patent is extended or adjusted under 35 U.S.C. 154(b) by 0 days.

(21) Appl. No.: 14/942,969

(22) Filed: Nov. 16, 2015

(65) Prior Publication Data

US 2016/0068386 A1 Mar. 10, 2016

Related U.S. Application Data

(62) Division of application No. 14/092,300, filed on Nov. 27, 2013, now Pat. No. 9,216,897.

(60) Provisional application No. 61/831,558, filed on Jun. 5, 2013.

(51) Int. Cl.
*H01L 41/113* (2006.01)
*B81B 3/00* (2006.01)
(Continued)

(52) U.S. Cl.
CPC ........ *B81C 1/00238* (2013.01); *B81B 3/0021* (2013.01); *B81B 3/0086* (2013.01);
(Continued)

(58) Field of Classification Search
CPC ... B81B 3/0021; B81B 3/0086; B81B 7/0006; B81B 2201/0257; B81B 2201/0264; B81B 3/0064; B81B 5/00; B81C 1/00158; B81C 1/00238; B81C 2203/035; B81C 2203/0785; H04R 19/04; H04R 7/08; H04T 19/005; H01L 41/42; H01L 2924/1461;
(Continued)

(56) References Cited

U.S. PATENT DOCUMENTS 7,104,129 B2 * 9/2006 Nasiri ................. B81C 1/0023
                                                    73/504.04
7,992,443 B2   8/2011 Opitz et al.
(Continued)

FOREIGN PATENT DOCUMENTS

CN    101426718    5/2009
CN    102625992 A  8/2012
(Continued)

OTHER PUBLICATIONS

Emadi et al. Development of a novel configuration for a MEMS ttransducer for low bias and high resolution imqging applications. Proceeding of SPIE—the International Society for Optical Engineering, Feb. 2013.*

*Primary Examiner* — Galina Yushina
(74) *Attorney, Agent, or Firm* — Maryam Imam; Klintworth & Rozenblat IP LLP

(57) ABSTRACT

A MEMS device includes a dual membrane, an electrode, and an interconnecting structure. The dual membrane has a top membrane and a bottom membrane. The bottom membrane is positioned between the top membrane and the electrode and the interconnecting structure defines a spacing between the top membrane and the bottom membrane.

19 Claims, 11 Drawing Sheets

(51) Int. Cl.
   *B81C 1/00*   (2006.01)
   *B81B 7/00*   (2006.01)
   *H04R 19/00*   (2006.01)
   *H01L 41/09*   (2006.01)
   *H04R 7/08*   (2006.01)
   *H04R 19/04*   (2006.01)

(52) U.S. Cl.
   CPC ........ *B81B 7/0006* (2013.01); *B81C 1/00158* (2013.01); *H04R 19/005* (2013.01); *B81B 2201/0257* (2013.01); *B81B 2201/0264* (2013.01); *B81B 2203/0127* (2013.01); *B81C 2203/035* (2013.01); *B81C 2203/0785* (2013.01); *H01L 41/0926* (2013.01); *H01L 41/0973* (2013.01); *H01L 41/1132* (2013.01); *H01L 41/1138* (2013.01); *H04R 7/08* (2013.01); *H04R 19/04* (2013.01)

(58) Field of Classification Search
   CPC ............. H01L 41/0926; H01L 41/0973; H01L 41/1132; H01L 41/1138
   See application file for complete search history.

(56) References Cited

U.S. PATENT DOCUMENTS

| | | |
|---|---|---|
| 2005/0136565 A1* | 6/2005 | Huff .................... B81C 99/0085 438/52 |
| 2006/0170012 A1 | 8/2006 | Larmer |
| 2007/0201710 A1 | 8/2007 | Suzuki et al. |
| 2009/0152655 A1 | 6/2009 | Laming et al. |
| 2009/0206422 A1 | 8/2009 | Illing et al. |
| 2011/0286610 A1 | 11/2011 | Miles |
| 2012/0033831 A1 | 2/2012 | Leitner |
| 2012/0139068 A1 | 6/2012 | Stacey |
| 2013/0001550 A1* | 1/2013 | Seeger .................... G01L 5/223 257/48 |

FOREIGN PATENT DOCUMENTS

| | | |
|---|---|---|
| TW | 200746868 | 12/2007 |
| TW | 201230266 | 7/2012 |
| WO | 2007096636 | 8/2007 |
| WO | 2010119415 | 10/2010 |
| WO | 2013003789 | 1/2013 |

* cited by examiner

CAPACITIVE SENSING STRUCTURE WITH EMBEDDED ACOUSTIC CHANNELS

CROSS REFERENCE TO RELATED APPLICATIONS

This application is a divisional of U.S. patent application Ser. No. 14/092,300, titled "Capacitive Sending Structure With Embedded Acoustic Channels", by Chan et al., filed on Nov. 27, 2013, which claims priority to U.S. Provisional Application No. 61/831,558, titled, "Capacitive Sensing Structure With Embedded Acoustic Channels", by Chan et al., filed on Jun. 5, 2013, the disclosures of which are incorporated herein by reference as though set forth in full.

BACKGROUND

Various embodiments of the invention relate generally to a MEMS device and particularly to a method for manufacturing the same.

Membrane structure is one of the crucial elements for acoustic devices, such as microphones. The key parameters of the membrane structure include its compliance, mass, and damping which determine its resonant frequency and quality factor.

Capacitive sensing basically measures the capacitive change due to air gap modulation. The gap is typically defined by a stationary electrode and a moving electrode which modulates the gap. To maximize the signal-to-noise (SNR) of the system, the gap of the capacitor needs to be optimized to make a compromise between maximizing the electrical sensitivity and minimizing the thermo-mechanical (or Brownian) noise due to damping.

To simultaneously achieve high mechanical sensitivity with adequately high resonant frequency and within the limit of supplying/pull-in voltage, the moving mass needs to be minimized. For a given acoustic aperture area which is normally specified by the application, the reduction of mass is equivalent to the reduction of thickness, which leads to the weakening of the mechanical strength of the structure and can often lead to yield issues in production as well as reliability issues during the usage.

One of the problems with conventional two-chip microphones is the requirement for large packaging which adds significantly to the total cost. In addition, parasitic capacitances are undesirably high because the two chips are wire bonded together.

To address the above-noted problems, the CMOS substrate and the MEMS substrate are integrated creating a one-chip solution. One of the significant advantages of this approach is the ability to lower the die cost by integrating CMOS and MEMS substrates through wafer-level bonding. The acoustic sensing membrane is built on the MEMS substrate (or "device") layer which also acts as the moving electrode and the stationary electrode is built on the CMOS substrate. Packaging size and consequently packaging costs are reduced and savings on footprint or area are realized by the microphone users. However, the electrical gap and acoustic gap become coupled, resulting in a trade-off between maximizing electric sensitivity and minimizing acoustic damping (thermo-mechanical noise) which limits the maximum achievable SNR.

What is desired is a small-packaged, low-cost MEMS device with high signal-to-noise ratio SNR. This is achieved by decoupling the electrical and acoustic gaps without compromising high resonant frequency from greater mass.

SUMMARY

Briefly, a MEMS device includes a dual membrane, an electrode, and an interconnecting structure. The dual membrane has a top membrane and a bottom membrane. The bottom membrane is positioned between the top membrane and the electrode and the interconnecting structure defines a spacing between the top membrane and the bottom membrane.

A further understanding of the nature and the advantages of particular embodiments disclosed herein may be realized by reference of the remaining portions of the specification and the attached drawings.

DETAILED DESCRIPTION OF EMBODIMENTS

Figure 1:
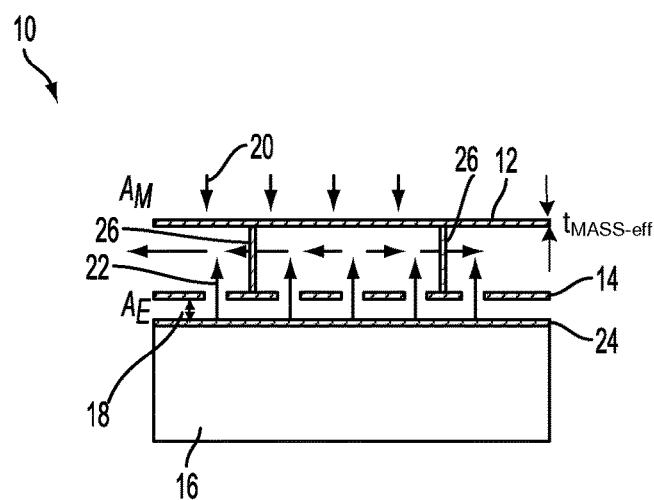
FIG. 1 shows a MEMS device 10, in accordance with an embodiment of the invention.

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors, microphones, and radio-frequency components. Silicon wafers containing MEMS structures are referred to as MEMS wafers.

In the described embodiments, MEMS device may refer to a semiconductor device implemented as a micro-electro-mechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space. Post may be a vertical structure in the cavity of the MEMS device for mechanical support. Standoff may be a vertical structure providing electrical contact.

In the described embodiments, back cavity may refer to a partial enclosed cavity equalized to ambient pressure via Pressure Equalization Channels (PEC). In some embodiments, back cavity is also referred to as back chamber. A back cavity formed with in the CMOS-MEMS device can be referred to as integrated back cavity. Pressure equalization channel also referred to as leakage channels/paths are acoustic channels for low frequency or static pressure equalization of back cavity to ambient pressure. In the described embodiments, a plate may refer to a rigid and planar structure within a MEMS device that moves when subjected to a force with vertical thickness significantly smaller than both of its in-plane dimensions. A back plate may be a stationary perforated plate used as an electrode typically configured opposing a movable force sensitive plate. A planar structure similar to a plate in geometry and more flexible towards two-dimensional out-of-the plane blending when subject to bending moment may be referred to as a membrane.

In the described embodiments, perforations refer to acoustic openings for reducing air damping in moving plates. Acoustic port may be an opening for sensing the acoustic pressure. Acoustic barrier may be a structure that prevents acoustic pressure from reaching certain portions of the device. Linkage is a structure that provides compliant attachment to substrate through anchor. Extended acoustic gap can be created by step etching of post and creating a partial post overlap over PEC. In plane bump stops are extensions of the plate which come in contact with the device seal to limit range of movement in the plane of the plate. Rotational bump stop are extensions of the plate to limit range of rotations.

Referring now to FIG. 1, a MEMS device 10 is shown, in accordance with an embodiment of the invention. The MEMS device 10 is shown to include a top membrane 12, a bottom membrane 14, an electrode 24, a CMOS substrate 16, and interconnecting structure 26. The top membrane 12 and the bottom membrane 14 collectively comprise a dual membrane. The bottom membrane 14 is shown positioned between the top membrane 12 and the electrode 24. The interconnecting structure 26 defines a spacing between the top membrane 12 and the bottom membrane 14.

The electrode 24 is shown formed in CMOS substrate 16. The top membrane 12, bottom membrane 14, and interconnecting structures 26 are a part of a MEMS substrate (also referred to herein as the "device layer"). Accordingly, the MEMS substrate is formed on top of the CMOS substrate 16.

The bottom membrane 14 is shown perforated allowing for air to travel in a direction and places shown by the arrows 22. Accordingly, air travels vertically up through the perforations of the bottom membrane 14 and horizontally thereafter and in between the top and bottom membrane. As shown by the arrows 20, acoustic pressure wave impinges on the top membrane 12. The change of acoustic pressure causes the top membrane 12 to move downwardly toward or upwardly away from the electrode 24. In some embodiments, the top electrode, the interconnecting structures 26, and the bottom membrane 14 move up and down together, causing gap 18 to change accordingly. Electrode 24 and the bottom membrane 14 form a capacitor. The change in gap 18 changes the capacitance of between bottom membrane 14 and electrode 24 thereby measuring changes in acoustic pressure.

Figure 2:
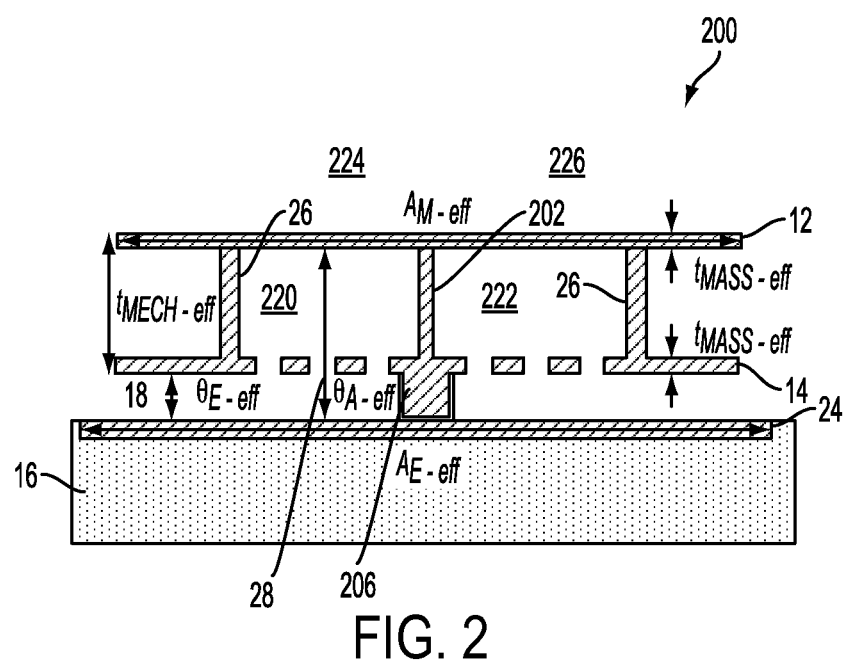
FIG. 2 shows a MEMS device 200, in accordance with another embodiment of the invention.

A gap 18 is defined by the standoff 206 as shown in FIG. 2. The area overlap between electrode 24 and bottom membrane 14 define an electrical sensing area, $A_E$. The top membrane 12 exposed to the acoustic pressure defines a mechanical sensing area, $A_M$. $A_M$ is advantageously large allowing for a larger input signal resulting in better mechanical sensitivity and higher signal to noise ratio. In this embodiment, the electrical sensing area is decoupled from the acoustic sensing area.

The dual membrane and the interconnecting structure 26 are movable relative to the electrode 24. Upon the application of acoustic pressure, the dual membrane and the interconnecting structure 26 translates in the direction of the applied acoustic wave. The top and bottom membranes 12 and 14 and the interconnecting structure 26 move together relative to the electrode 24.

In some embodiments of the invention, the displacement of the top membrane 12 is not the same as the displacement of the bottom membrane 14. In other embodiments, the displacement of the top membrane 12 is substantially the same as the displacement of the bottom membrane 14. Displacement of the top membrane 12 relative to the bottom membrane 14 is controlled by the thickness of the membranes as well as the location, shape, size and quantity of the interconnecting structure 26.

In some embodiments, the interconnecting structure 26 provides an electrical connection between the top and bottom membranes 12 and 14. In some embodiments, interconnecting structure 26 allows channeling of air thereby reducing damping associated with the MEMS device 10. The interconnecting structure 26 may be made of one or more pillars, a wall, a hollow structure, or a solid structure.

It is desirable for both the top membrane 12 and the bottom membrane 14 to be thin and therefore reducing the total mass of the structure, which could increase sensitivity, resonant frequency or both. The design of the interconnecting structure is critical and needs to be optimized to maintain rigidity of the MEMS structure with a small mass contribution. With a small mass, the resonant frequency of the structure increases and is pushed out from the frequency range of interest, effectively lowering the noise contribution.

Furthermore, the interconnecting structure 26 forming an I-beam or pillar structure with the top membrane 12 and the bottom membrane 14 improves sturdiness thus preventing the problem of fragility associated with the thin top membrane 12. In some embodiments of the invention, the top membrane 12 is made of silicon nitride (SiN). The bottom membrane 14 is made of a conductive material. The top membrane 12 may be conductive or non-conductive. Similarly, the interconnecting structure 26 may be conductive or non-conductive.

In an embodiment of the invention, the electrode 24 is made of aluminum. In an embodiment of the invention, the CMOS substrate 16 and the MEMS substrate are bonded by aluminum-germanium eutectic bonds or any other similar bonding methods through the standoff. The attachment of the CMOS and MEMS substrates form an electrical connection there between. The standoff material is conductive and the thickness of the standoff defines the electrical sensing gap 18. It is desirable for the gap 18 to be small thereby increasing electrical sensitivity. The CMOS substrate 16 includes circuitry for signal processing. Upon acoustic pressure, arrow 20, applied to the top membrane 12, there is movement or deformation of the top membrane 12 translating through the interconnecting structures 26 to the bottom membrane 14, causing the gap 18 to change. This change is then sensed by the electrical circuits of the CMOS substrate 16. As the bottom membrane 14 moves, air trapped in the gap 18 is squeezed and is allowed to escape through the perforations in the bottom membrane 14, indicated by arrow 22, across the interconnecting structures, thus reducing the damping. Hence the effective acoustic gap 28, $\theta_{A\text{-}eff}$ (shown in FIG. 2) can be defined as a combination of the electrical gap 18, $\theta_{E\text{-}eff}$, the thickness of bottom membrane 14 and the spacing between the top membrane 12 and bottom membrane 14.

In summary, one of the advantages of the MEMS device 10 is the decoupling of minimization of thermo-mechanical noise from the maximization of the electrical sensitivity. The Brownian noise depends on the effective acoustic gap $\theta_{A\text{-}eff}$ while the electrical sensitivity depends on the effective electric gap 18 $\theta_{E\text{-}eff}$. Since these two gaps could be independently adjusted without affecting the other, the maximization of electrical sensitivity and minimization of thermo-acoustic noise can be effectively decoupled.

Another advantage of the MEMS device 10 is the decoupling of the minimization of the mass or the maximization of the sensitivity-to-frequency-square product from the maximization of the structural strength to enhance both the yield and reliability. The effective thickness of the structure of the MEMS device 10 is approximately the sum of that of the top membrane 12 and the bottom membrane 14, and the interconnecting structure 26, defined as $t_{MECH\text{-}eff}$. This thickness enhancement contributed by the interconnecting structure improves the structural rigidity, as compared to a single thin membrane. The mass can be made small through controlling the thickness of the two membranes $T_{MASS\text{-}eff}$ during thin-film deposition as well as design and placement of the interconnecting structures. As a result, this dual-plate membrane structure can simultaneously achieve light mass and increased compliance of the structure to improve the mechanical sensitivity and reduce the potential of breakage and stiction issues during fabrication and operation of the MEMS device 10.

In another embodiment of the invention, in cases where the MEMS device 10 is a microphone, the mechanical and electrical sensing areas can overlap and the transduction can occur at separate membranes of the dual-plate membrane structure, therefore maximizing both mechanical and electrical sensing areas. This approach significantly increases, the both the mechanical and electrical sensing areas compared to other CMOS-MEMS integration designs as discussed in IVS 195 patent application. Thus, high SNR and low-cost microphones with internal back cavity could be realized. Examples of microphones that the MEMS device 10 can include torsional and piston which respectively has rotational and translational movements.

FIG. 2 shows a MEMS device 200, in accordance with another embodiment of the invention. The top and bottom membranes 12 and 14 are thin membranes, as discussed above, and this rigidly connects mechanically, the top and bottom membranes 12 and 14 to through high aspect-ratio column structure formed also by the interconnecting structure 26. A pressure differential on the left side of the top membrane 12 is the pressure difference between 224 and 220, while the pressure differential on the right side of the top membrane 12 is the pressure difference between 226 and 222. In a torsional microphone, rotational displacement occurs when there is a difference in the pressure differential across the membrane between the left side and right side.

In an embodiment, since the gap is fixed by the standoff 206, the average gap does not change through translation along the vertical direction; instead, the rotation of the dual membrane is sensed differentially by measuring the capacitance difference between two capacitances created, correspondingly, by left portions of membrane 14 and electrode 24 ("left" with respect to standoff 26) and by the right portions of membrane 14 and electrode 24.

The perforations of the bottom membrane 14 allow air to be routed up/down through the holes of the bottom membrane 14 from the lower cavity of the MEMS device 10 and to flow horizontally through the acoustic channel formed between the bottom membrane 14 and the top membrane 12.

The MEMS device 200 is the torsional analogy to the MEMS device 10, describing part of the MEMS structure when anchored to the CMOS substrate. The interconnecting structure 202 is shown to be connected through the bottom membrane 14 to the standoff and finally anchored through bonding to the electrode 24. The anchor is both a mechanical and electrical connection. One of the advantages of this anchored-torsional dual plate has is the differential sensing to remove the sensitivity shift due to the change of electrical gap. Besides mechanical sensitivity stability, differential sensing is also easier to implement in CMOS front-end sensing circuit to minimize the electrical offset shift. The second advantage is its relative robustness against the acoustic/pressure impulses since the landing area are at the edges compared to the piston implementation whose central portion of the membrane will be contact with the bottom electrode and is easier to become stuck or damaged.

Figure 3:
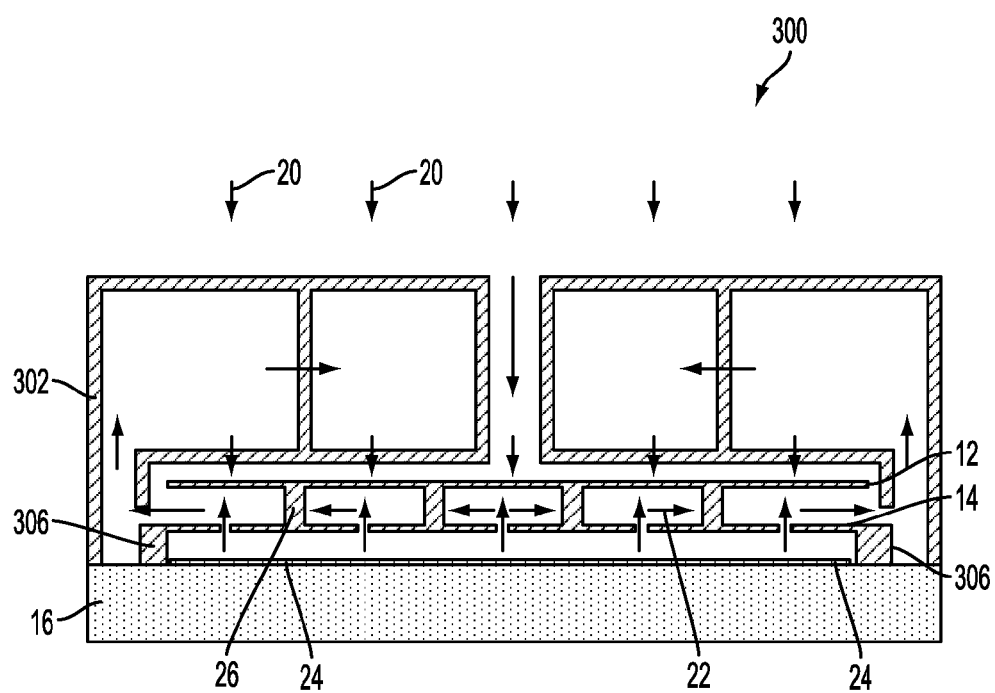
FIG. 3 shows a MEMS device 300, in accordance with an embodiment of the invention.

FIG. 3 shows a MEMS device 300, in accordance with an embodiment of the invention. In the embodiment of FIG. 3, the MEMS device 300 is shown to include an internal back cavity. Acoustic wave enters through an acoustic port in the handle wafer, shown by arrow 20 to hit on the top membrane 12. As the top membrane 12 displaces, the interconnecting structure 26 and bottom membrane 14 moves along the direction of the acoustic wave, changing the electrical gap 18 formed between the bottom membrane and electrode 24. Air, shown by the arrows 22, then travels through the perforated bottom membrane and the interconnecting structures 26 and gets channeled into the back cavity 302. The standoffs 306 electrically connect the bottom membrane 14 to the electrode 24 on the CMOS wafer 16. The standoffs 306 serve as anchors. The MEMS device 300 emphasizes on the integration of the back cavity into the CMOS-MEMS chip which provides advantage of low cost without the requirement for extra packaging as in standard 2-chip solutions and extra-compact size which could be crucial for many mobile and wearable applications.

Figure 4:
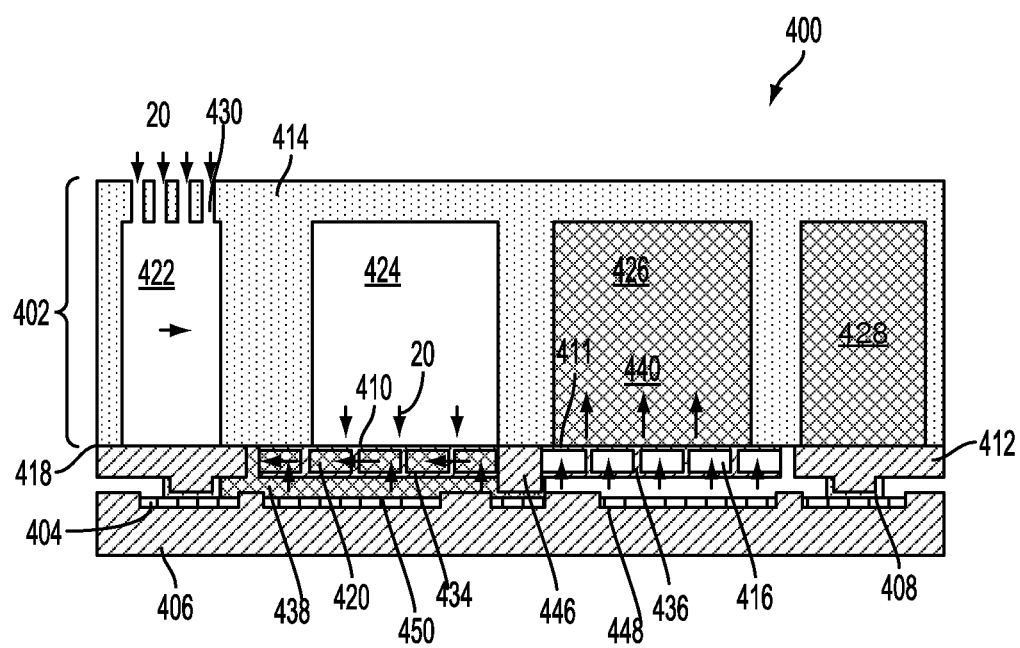
FIG. 4 shows a MEMS device 400, in accordance with another embodiment of the invention.

FIG. 4 shows a MEMS device 400, in accordance with another embodiment of the invention. The MEMS device 400 is a torsional microphone whereas the device in the previous figure is a piston microphone. The MEMS device 400 is shown to have a device layer 412 formed on top of the CMOS substrate 406. This device layer comprises of the top membrane 410/411 and bottom membrane 434 separated by the interconnecting structure 436, this spacing between the top and bottom membrane shown at 420 and 416 is the main contributing acoustic gap. The bottom membrane 434 is shown separated from the electrode 448/450 via a gap 438. A handle wafer 402 is shown bonded on top of the device layer 412 by the bond 418. The handle wafer 402 and the device layer 412 are two separate substrates. In an embodiment of the invention, the bond at 418 is oxide and is used to fusion bond the handle wafer 402 and the device layer 412. In the handle wafer, cavities 422, 424, 426 and 428 and acoustic port openings 430 are etched onto the substrate before bonding. Acoustic input enters through the acoustic port at arrow 20 to enter the back cavity 422 and 424 to impinge on the top membrane 410. As the dual-plate membrane moves in the direction of the acoustic input, the gap 438 between the bottom membrane 434 and electrode 450 changes. Air in the gap 438 gets squeeze, moving through the perorated bottom membrane into the spacing 420 and gets directed into back cavity 426 and 428. In a similar fashion, The right part of dual-plate membrane 411 at back cavity 426 moves in the direction opposite to the direction of the acoustic input shown by arrow 440 driven by the pressure differential between back cavity 426 and the cavity 416 in between right top membrane 411 and the right bottom electrode 448 connected to cavity 424. Standoff 446 defines the gap 438 and serves as the electrical and mechanical anchor or pivot for the torsional microphone structure. Germanium or a conductive layer 408 is formed between the electrode 404 and the standoff 446. In an embodiment of the invention, the bond between the electrode 404 and the conductive layer 408 is a eutectic bond.

Figure 5:
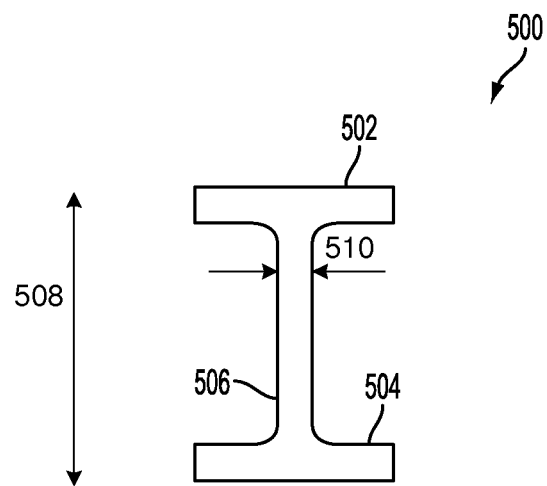
FIG. 5 shows an I-beam structure 500 employed by the MEMS devices of the various embodiments of the invention.

FIG. 5 shows an I-beam structure 500 employed by the MEMS devices of the various embodiments of the invention. I-beam structure 500 is an embodiment of interconnect structure 26. The I-beam 500 is shown to have a flange 502, a flange 504 connected together with a center reinforcement beam 506. Flange 502 is the top membrane and flange 504 is the bottom membrane. Each of the flanges 502 and 504 has a minimal thickness whereas the beam 506 is desired to have high aspect ratio such that its length 508 is larger than its thickness 510. The beam 506 connects the flanges 502 and 504 and be a structural connection or/and an electrical connection. Flanges 502 and 504 and the beam 506 can be made of silicon or polysilicon or SiN or other suitable material.

Figure 6:
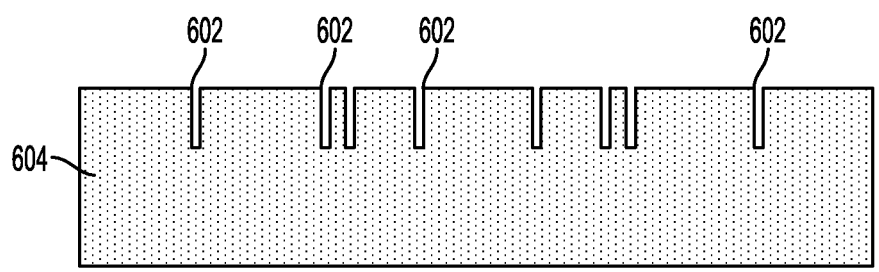
FIGS. 6-27 show relevant steps for fabricating a MEMS device, in accordance with a method of the invention.

FIGS. 6-27 show relevant steps for fabricating a MEMS device, in accordance with a method of the invention. In FIG. 6, narrow gaps 602 are etched into silicon substrate 604 to define the minimum critical dimensions associated with the minimum lateral acoustic channels between moving and fixed structures. The depth of the etch of the trench into which narrow gaps 602 are etched determines the height of the spacing between the top and bottom membrane.

Figure 7:
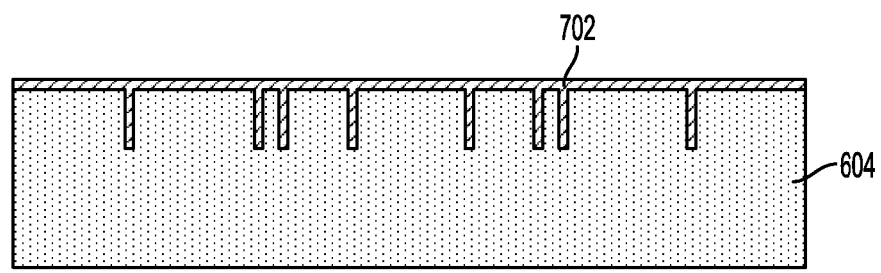
Figure 8:
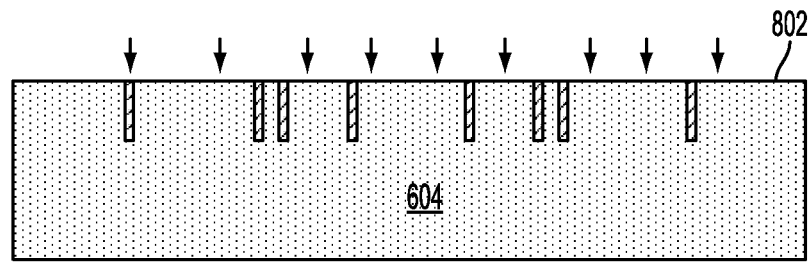
Figure 9:
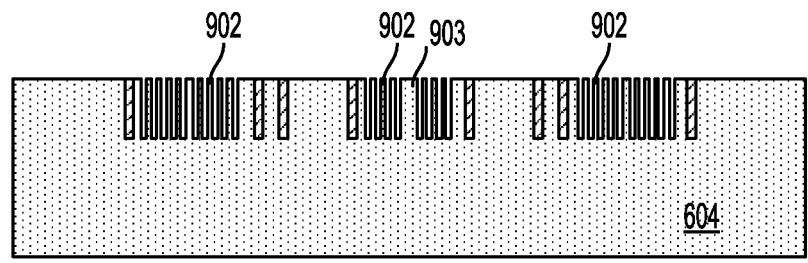
Figure 10:
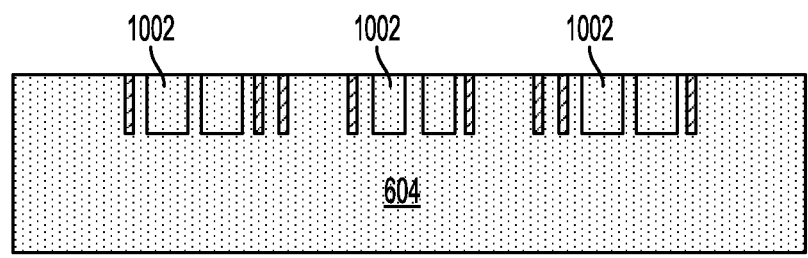
Figure 11:
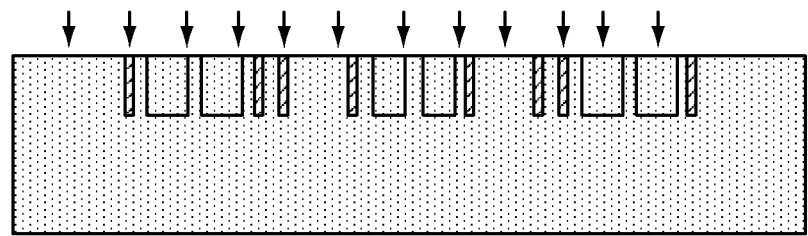
Figure 12:
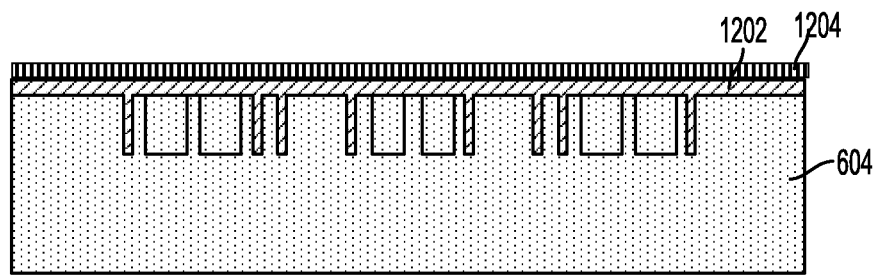

In FIG. 7, the gaps 602 are filled with silicon nitride or Si3N4 and in FIG. 8, chemical mechanical polishing (CMP) is used to retain a flat silicon surface 802. In FIG. 9, trenches 902 are etched into the substrate 604, which is made of silicon. This leaves behind silicon pillars structures with narrow widths 902 and wide widths 903. In FIG. 10, thermal oxide growth is performed. During the thermal oxidation, the trenches are refilled with silicon dioxide. At the same time silicon pillars with the narrow widths are consumed and turned into sacrificial silicon dioxide (SiO2) blocks 1002. The wider silicon pillars are only partially consumed leaving behind a single crystal silicon pillar structure that becomes the interconnecting structure. In FIG. 11, CMP is performed. The CMP step polishes the silicon (substrate 604) to obtain a flat surface onto which a thin polysilicon 1202 deposition takes place forming the top membrane, as shown in FIG. 12, a protective thin oxide 1204 is deposited to form the mask for subsequent steps.

Figure 13:
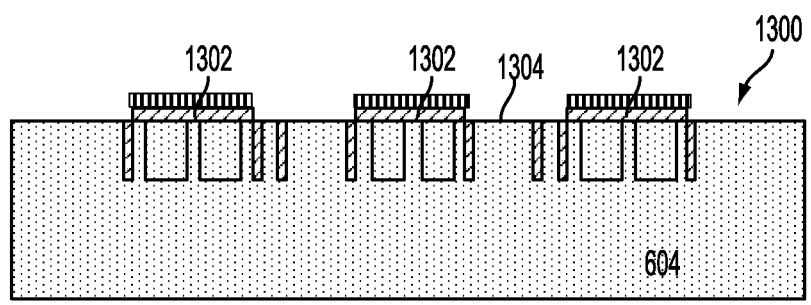

In FIG. 13, the polysilicon 1202 and the oxide 1204 are patterned to form the top membrane over the sacrificial silicon dioxide block as 1302 and expose the locations 1304 where fusion bond is to occur. This completes the process of forming the device layer. Next, steps are shown and discussed for forming the handle wafer.

Figure 14:
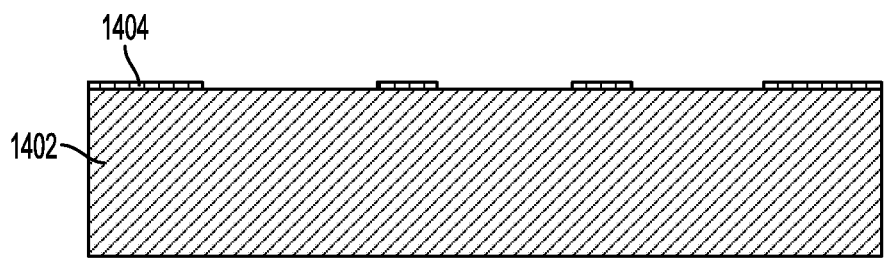
Figure 15:
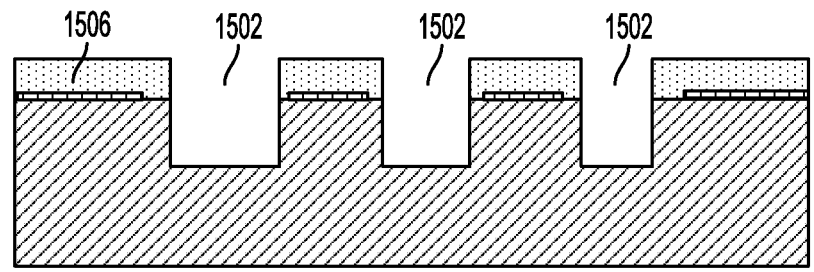
Figure 16:
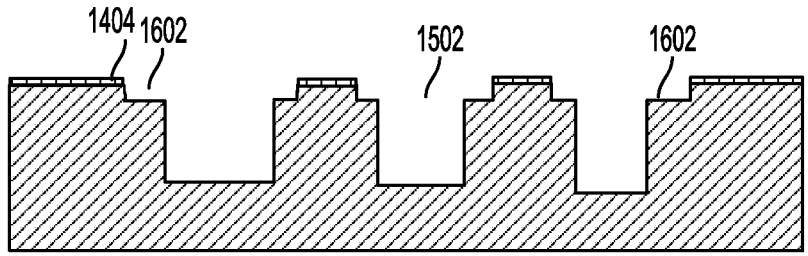
Figure 17:
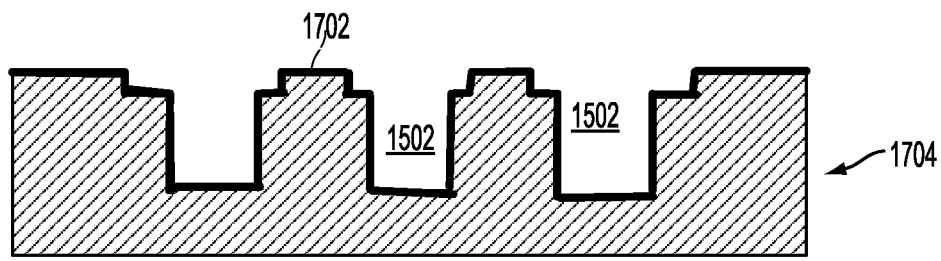
Figure 18:
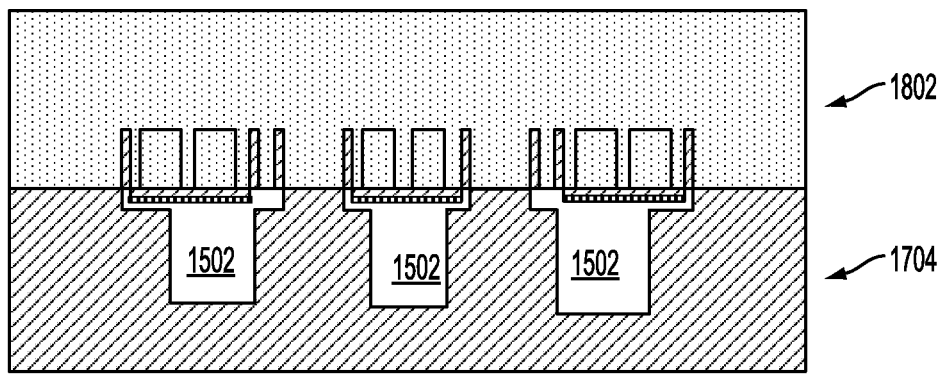

In FIG. 14, on a silicon handle wafer 1402 separate than that which the device layer is formed, is patterned with a silicon oxide layer mask 1404. Next, in FIG. 15, additional photolithography is performed with silicon etches defining the depth of the deep upper cavities 1502. In FIG. 16, the photoresist 1506 is removed and etching of the silicon substrate 604 to a shallower depth 1602 using the hard mask 1404 defining the shallow section of the upper cavities. In FIG. 17, oxidation is performed on the handle wafer 1704 to grow a thin oxide layer 1702 for fusion bonding. In FIG. 18, the handle wafer 1704 is bonded to the MEMS handle wafer 1802 which is similar to 1300 of FIG. 13. In an exemplary method, fusion bonding is performed.

Figure 19:
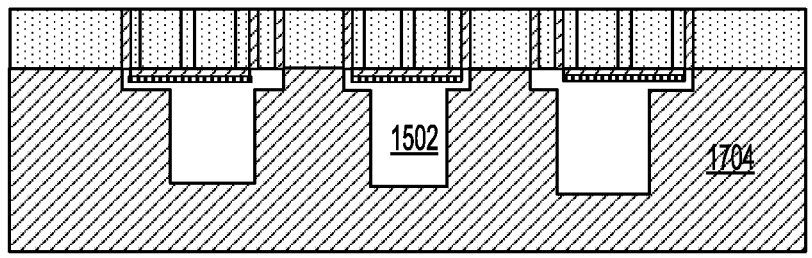
Figure 20:
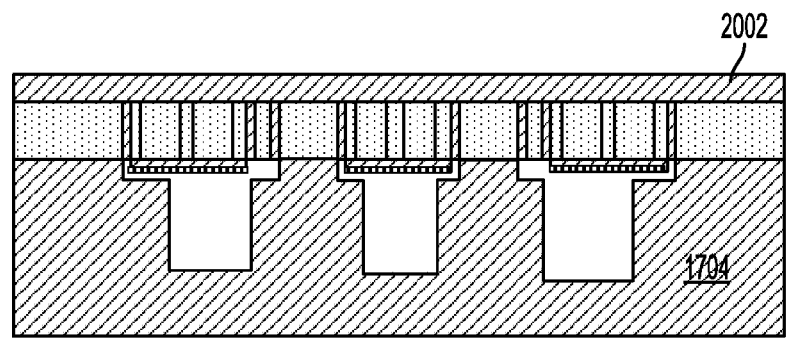

In FIG. 19, grinding and polishing is done with the sacrificial oxide and nitride trenches as a polish stop. In FIG. 20, a second polysilicon layer 2002 is deposited. The thickness of the layer 2002 depends on the standoff height (electrical gap) and the bottom membrane thickness required.

Figure 21:
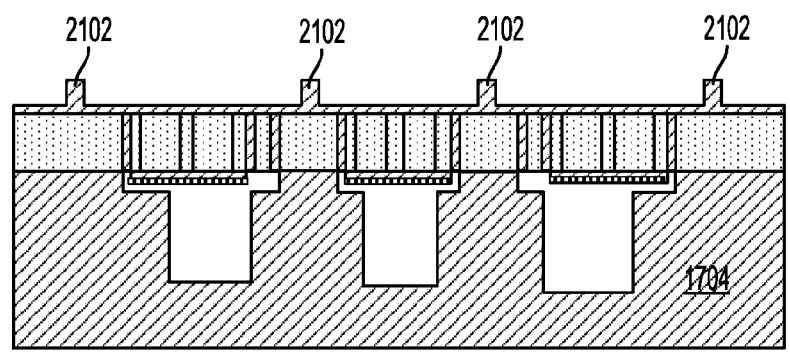
Figure 22:
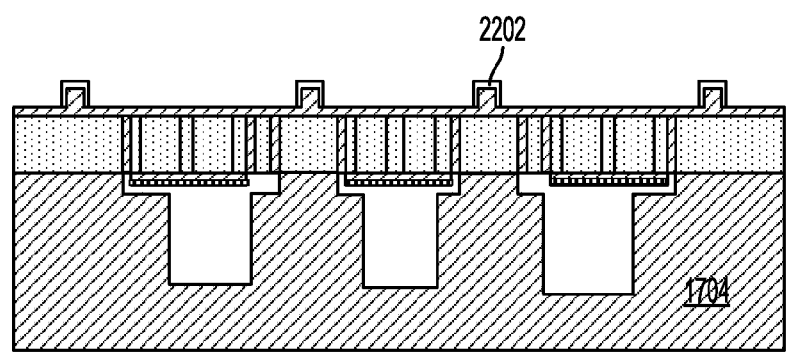

In FIG. 21, the polysilicon layer is patterned and etched down to define the standoff 2102. The etch controls the mechanical gap between the structure and the electrode in the CMOS substrate. In FIG. 22, a germanium layer 2202 is deposited and etched to have germanium only on the standoff 2102.

Figure 23:
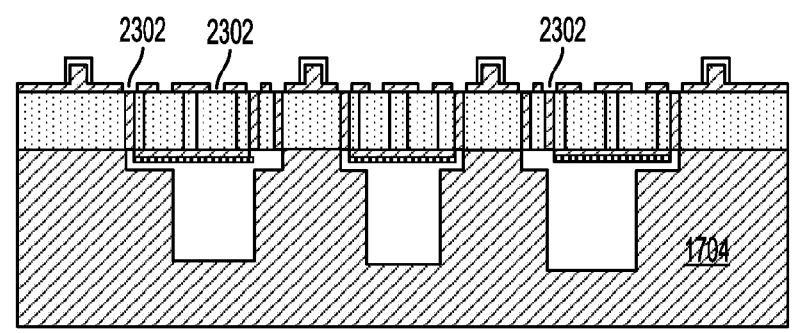
Figure 24:
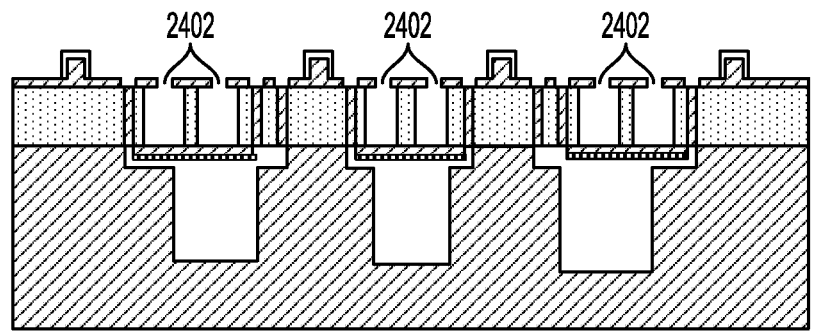
Figure 25:
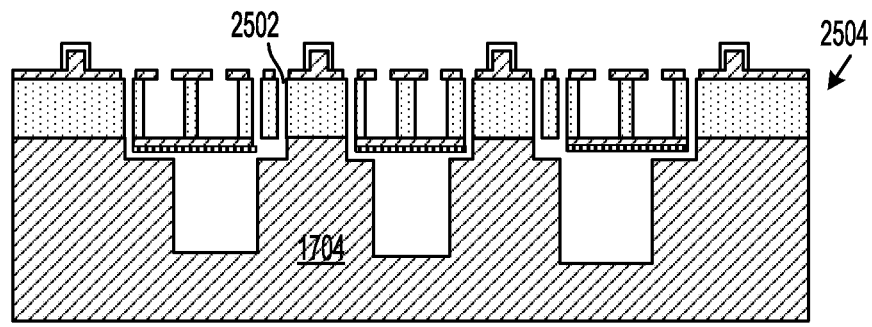
Figure 26:
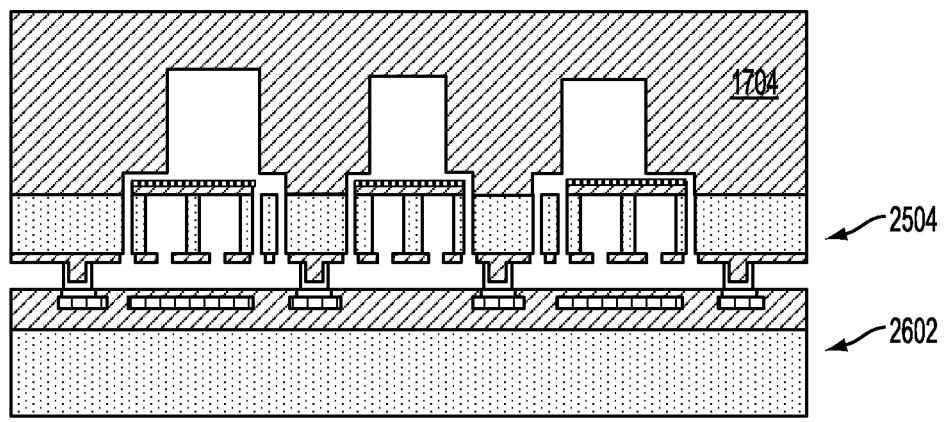
Figure 27:
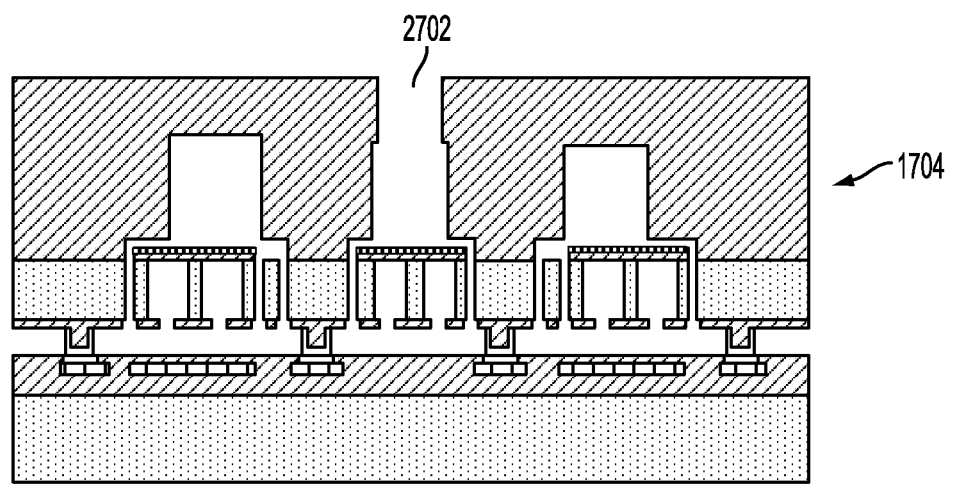

In FIG. 23, another lithography and polysilicon etch step is performed defining the perforations 2302 on the bottom membrane. In FIG. 24, hydrofluoric acid (HF) vapor release step is used to remove the sacrificial oxide block 2402. At step 25, a second silicon nitride etch step releases the MEMS device structure 2504 at 2502. In FIG. 26, the MEMS device structure 2504 is bonded with the CMOS substrate 2602 using aluminum germanium bonding. Grinding and etching of the integrated wafer is performed to thin the substrate. The MEMS device is formed having the CMOS substrate 2602 on top of which is shown the MEMS device structure 2504, on top of which is shown the handle wafer 1704. Lastly, in FIG. 27, a port is etched into the handle wafer 1704 to form the acoustic port 2702.

Although the description has been described with respect to particular embodiments thereof, these particular embodiments are merely illustrative, and not restrictive.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. A method of manufacturing a micro-electro-mechanical system (MEMS) device comprising:
    forming an electrode on top of a complementary metal-oxide-semiconductor (CMOS) wafer;
    forming a moveable dual-plate membrane with top and bottom membranes on top of the electrode, the moveable dual plate membrane forming a MEMS device wafer;
    forming an interconnecting structure, wherein the moveable dual-plate membrane and the interconnecting structure create a MEMS on the MEMS device wafer, the interconnecting structure being positioned between the top and bottom membranes and
    bonding the CMOS wafer to the MEMS device wafer and causing electrical connection between the CMOS wafer and the MEMS device wafer, the interconnecting structure electrically connecting the top and the bottom membranes.

2. The method of claim 1, wherein the bonding comprises eutectic bonding.

3. The method of claim 1, further including forming standoffs on the MEMS wafer.

4. The method of claim 1, further including depositing polysilicon on the MEMS wafer before forming the standoffs.

5. The method of claim 1, further including forming standoffs between the bottom membrane and the electrode, the standoffs electrically connecting the bottom membrane and the electrode.

6. The method of claim 1, further including thinning the CMOS wafer.

7. The method of claim 1, wherein the forming the moveable dual-plate membrane comprising forming a top membrane and a bottom membrane.

8. The method of claim 7, further including forming perforations in the bottom membrane.

9. The method of claim 1, further including bonding a handle wafer on top of the moveable dual-plate membrane, the handle wafer including at least one acoustic port.

10. The method of claim 1, further including creating the interconnecting structure from a single crystal silicon pillar structure left over from partially consumed silicon pillars.

11. The method of claim 1, wherein the bottom membrane is made of a conductive material.

12. The method of claim 1, wherein the electrode is made of aluminum.

13. The method of claim 3, wherein the bonding step includes bonding the CMOS wafer and the MEMS device wafer by aluminum-germanium eutectic bonds through the standoff.

14. The method of claim 3, wherein the standoff is made of conductive material and a thickness of the standoff defines an electrical sensing gap between the electrode and the bottom membrane.

15. The method of claim 3, wherein the interconnecting structure is anchored through bonding to the electrode.

16. The method of claim 3, wherein the top electrode, the interconnecting structure, and the bottom membrane move up and down together, causing a gap formed between the bottom membrane and the electrode to change accordingly.

17. The method of claim 1, further including forming more than one interconnecting structure between the top and bottom membranes.

18. The method of claim 1, wherein a change of acoustic pressure causing the top membrane to move downwardly toward or upwardly away from the electrode.

19. The method of claim 1, wherein a pressure differential is formed on a left side of the top membrane by a pressure difference between a pressure on a left side of the interconnecting structure and a top of the top membrane and a pressure on the left side of the interconnecting structure and a bottom of the top membrane, while a pressure differential on a right side of the top membrane is formed by a pressure difference between a pressure on the right side of the interconnecting structure and the top of the top membrane and the pressure on the right side of the interconnecting structure and the bottom of the top membrane.

* * * * *